United States Patent [19]
Sheyon et al.

[11] Patent Number: 4,793,883
[45] Date of Patent: Dec. 27, 1988

[54] METHOD OF BONDING A SEMICONDUCTOR CHIP TO A SUBSTRATE

[75] Inventors: Gregory M. Sheyon; Joseph A. Aurichio, both of Anderson, S.C.

[73] Assignee: National Starch and Chemical Corporation, Bridgewater, N.J.

[21] Appl. No.: 885,127

[22] Filed: Jul. 14, 1986

[51] Int. Cl.⁴ .............................................. B32B 31/26
[52] U.S. Cl. ..................... 156/235; 156/238; 156/247; 156/248; 156/249; 156/257; 156/268
[58] Field of Search ............... 186/235, 238, 240, 241, 186/257, 268, 247–249

[56] References Cited

U.S. PATENT DOCUMENTS

| | | | |
|---|---|---|---|
| 3,554,832 | 1/1971 | Fischer | 156/241 X |
| 3,600,246 | 8/1971 | Breen | 156/64 |
| 4,284,457 | 8/1981 | Stonier et al. | 156/238 X |
| 4,606,962 | 8/1986 | Reylek et al. | 428/148 |
| 4,664,739 | 5/1987 | Aurichio | 156/235 |

FOREIGN PATENT DOCUMENTS

| | | |
|---|---|---|
| 0-134606 | 3/1985 | European Pat. Off. |
| 57-145339 | 8/1982 | Japan . |
| 59-57438 | 4/1984 | Japan . |

Primary Examiner—David Simmons
Attorney, Agent, or Firm—Royal N. Ronning, Jr.; Edwin M. Szala

[57] ABSTRACT

The bonding of semiconductor chips to a substrate is described wherein the first step involves the bonding of a tacky, curable and partially cured chip bonding adhesive, which is releasably supported on a support film, to the surface of the chip intended to be bonded to the substrate. The second step involves the further partial heat curing of the adhesive to convert it to a non-tacky state so that the adhesive will not undesirably stick during handling and storage operations. Thereafter, the chip with its adherent adhesive can be mounted to a substrate at elevated temperature to convert the adhesive to a more tacky state. The final step involves the curing of the adhesive after it has been used to bond the chip to the substrate.

2 Claims, No Drawings

METHOD OF BONDING A SEMICONDUCTOR CHIP TO A SUBSTRATE

BACKGROUND OF THE PRESENT INVENTION

1. FIELD OF THE INVENTION

The present invention relates to a method of bonding a semiconductor chip to a substrate.

2. DESCRIPTION OF THE PRIOR ART

U.S. Pat. No. 3,600,246 to J. Breen describes a method of making laminated semiconductor devices. The Breen patent describes, as a first step in its process, the application of a bonding cement to a semiconductor wafer while the bonding cement is in a viscous condition. Two methods which can be used to apply the adhesive include the silk screening of the adhesive onto the wafer or the application of a layer of the adhesive by means of a spatula or the like. Following application of the adhesive to the wafer, it is heated to convert it from a viscous state to a non-tacky, relatively firm state. The conversion of the adhesive to such a state facilitates the further handling of the wafer, e.g., the scribing and testing of the wafer, or simple storage of the wafer, without having the wafer stick to the various operating and handling means that might be employed. When it is desired to reconvert the cement to an adhesive state preparatory to the bonding of a chip to a desired substrate, the cooled, non-tacky cement can be reconverted to such a viscous state by a subsequent heating step, which, if continued long enough, causes curing of the cement.

Published European Patent Application No. 134,606, published Mar. 20, 1985, describes a carrier film containing a non-viscous conductive adhesive for the dicing of semiconductor wafers. This disclosure was limited to provision of a support film containing a releasably bonded adhesive which would support a semiconductor wafer during its dicing. The adhesive would be either dried or partially cured to a suitable tacky state so that the wafer could be attached thereto preparatory to the dicing operation. The disclosure of this patent publication merely calls for the dicing of the semiconductor wafer while it is on the adhesive with the removal of the adherent adhesive, while still in the tacky state, and the subsequent placement of the resultant chip and adherent adhesive layer on a chip support.

SUMMARY OF THE PRESENT INVENTION

The present invention relates to a method of bonding a semiconductor chip to a substrate which comprises the initial step of bonding a tacky, curable and partially cured, non-viscous chip bonding adhesive, which is releasably supported on a support film, to the surface of the chip intended to be bonded to the substrate. The next step involves the further partial heat curing of the adhesive to convert it to a non-tacky state so that the semiconductor chip and adherent adhesive can be stored without sticking of such a composite to undesired materials. Thereafter, the chip, with adherent adhesive, is mounted on a substrate at elevated temperature so that the adhesive is converted to a more tacky state to suitably wet out and bond to the substrate. The final step of the present process involves the final heat curing of the adhesive while the chip is bonded to the substrate.

DETAILED DESCRIPTION OF THE PRESENT INVENTION

The types of adhesives which are particularly preferred for use in the present invention are described and claimed in U.S. Pat. No. 4,652,398, which is incorporated herein by reference. Such adhesives comprise an epoxy resin, a soluble polyimide resin, a suitable reactive diluent, and a polyalkenylphenol crosslinking agent. Further details regarding such adhesives are contained in the above-referenced copending application with representative formulations for such adhesives being given in Examples 1 and 5 contained herein. Other types of chip bonding adhesive, having similar properties, can also be used.

The foregoing types of adhesives, in accordance with the present invention, are releasably held by a support film. Further details regarding the type of film are contained in the aforementioned European Patent Publication No. 134,606, as well as copending U.S. Ser. Nos. 840,461 and 744,352, filed Mar. 6, 1986 and June 13, 1985. Basically, the adhesives are releasably supported on a support film which preferably contains a release coating holding a suitable pattern of curable, conductive die bonding (or chip bonding) adhesive. As used in the present application, the term "chip" is intended to designate either a collection of chips bonded together in a semiconductor wafer configuration or the individual chips themselves. In either case, the present invention envisions the transfer of the adhesive to either the wafer forming the collection of chips or to the chip itself in the intended placement position for the ultimate bonding of a chip to a suitable substrate. The adhesive is in a tacky, non-viscous state when it is bonded to the chip but is yet curable, having only been partially cured, when on the support tape. This technique for bonding a tacky, curable and partially cured chip bonding adhesive, which is releasably held on a support film, to the chip represents a novel point of departure from the prior art procedure shown in U.S. Pat. No. 3,600,246 to J. Breen.

Subsequent to the bonding of the chip bonding adhesive of the chip, the adhesive, while adherent to the chip or the chip portion of the wafer, is further partially heat cured to convert it to a non-tacky state so that in subsequent handling operations or storing conditions, the chip/adhesive composite will not become undesirably attached to either other chip/adhesive composites or to the handling or storage apparatus or implements utilized. When it is desired to finally mount the chip on a suitable substrate, the mounting is accomplished by use of an elevated temperature to change the adhesive to a more tacky state so that when it meets with the substrate it will suitably wet out and bond to the substrate. Thereafter, further heat curing of the adhesive is conducted to finalize the bond.

The present process can be utilized in a variety of ways by a desired end user of the present process. For example, the adhesive could be transferred to a semiconductor wafer, the wafer/adhesive composite can further be B-staged followed by the scribing of the wafer, the cracking of the wafer into individual chips with an adherent adhesive layer, and the subsequent mounting and curing of the chip/adhesive composite. An alternative way of proceeding is to first transfer adhesive to a wafer with a subsequent B-staging step to form a wafer/adhesive composite which is non-tacky. Such a composite can then be mounted on a suitable conventional, tacky adhesive wafer dicing film (e.g., Nitto brand film) for dicing of the wafer into chips. Alternatively, the wafer can be scribed and cracked while mounted on the conventional film. Either of the foregoing possibilities results in a chip/adhesive composite which is then mounted and cured. Another possibility for use of the present process is to mount the wafer on the type of dicing film earlier described with the suitable scribing of the wafer into individual chips. The individual chip with adherent adhesive can then be released from the support carrier film with the further B-staging of the adhesive to a non-tacky state. The scribed wafer can then be cracked into individual chips which can be mounted using the adherent adhesive layer, and a final curing step can then be performed.

The present invention is further illustrated by the example which follow:

EXAMPLE 1

This Example illustrates the ingredients used in the preparation of the type of curable chip bonding adhesive described and claimed in U.S. Pat. No. 4,652,398, for use in regard to the present invention.

The following ingredients were used:

| Ingredient | Parts by Weight |
| --- | --- |
| Soluble polyimide resin | 4.0 |
| N—vinyl pyrrolidone | 16.0 |
| Phenyl glycidyl ether | 16.0 |
| Phenol epoxy novolac resin | 16.0 |
| 2,2'-dialkyl bisphenol A* | 12.0 |
| 2-ethyl-4-methyl imidazole** | 2.0 |
| Triallyl-S—triazine-2,4,6-trione | 6.0 |
| Di-t-butyl peroxide | 1.0 |
| Silica filler | 0.4 |
| Silver powder | 130.0 |

*67% on N—methyl pyrrolidone solvent.
**10% solution in N—methyl pyrrolidone solvent.

EXAMPLE 2

The adhesive from Example 1 was used to screen print a circular pattern (4 inches in diameter) of chip bonding adhesive onto a release-coated polyethylene carrier sheet (AKROSIL 2G/0 brand). The resulting product was B-staged for 16 minutes at 140° F. and then covered with a cover sheet (H. P. Smith S(10) brand) to protect the adhesive surface from contamination with foreign matter.

Subsequently, the cover sheet was removed and a 4 inch-diameter semiconductor silicon wafer was mounted onto the adhesive patter using a Kulicke & Soffa Model 366 wafer mounter. The wafer and adherent chip bonding adhesive were then stripped away from the release-coated carrier film. The wafer, with adherent adhesive, was placed in a forced air oven at 80° C. so that the adhesive could further be B-staged for 10 minutes. The adhesive was deemed to be tack-free after being allowed to cool to room temperature. The wafer, with adherent, tack-free curable chip bonding adhesive, was placed on the vacuum chuck of a Disco brand dicing machine and was scribed to approximately 80% of the wafer's thickness. The wafer was then cracked into individual chips or die (200×200 mil), each with an adherent adhesive backing.

The chips or die, with adherent adhesive, were each mounted using a Kulicke & Soffa manual die mounter with scrub options onto two differing substrates at 100° C. One was a lead frame of silver spotted Alloy 42. The other was glass. The dwell time of the adhesive on the substrate was about 5 seconds with 100 gm pressure. Under these conditions, the adhesive became tacky again and wetted out the substrate. The mounted chips were then cured at 120° C. for 20 minutes followed by 225° C. for 30 minutes. The chips mounted on the glass substrate showed very little to no void formation in the adhesive layer with total surface contact between the adhesive and substrate. The die shear values were in excess of 30 pounds for the glass-mounted die and in excess of 21 pounds for the die mounted on the Alloy 42 lead frame fingers.

EXAMPLE 3

Example 2 was followed with the exception that the B-staging of the wafer/adhesive composite was at a temperature of 80° C. for 20 minutes. The composite was then mounted on a tacky dicing film (NITTO SVP-255 brand) and the wafer/adhesive composite was diced completely through forming the desired chips. The chips, with adherent adhesive, were satisfactorily removed from the diced wafer/adhesive composite and placed on the substrates by a pick and place technique. Comparable results were obtained to those shown in Example 2.

B-staging of the wafer/adhesive composite for only 10 minutes resulting in a tendency for the adhesive to split with a small residue being left on the tack NITTO brand film. Increase in the B-staging time to 30 minutes, on the other hand, gave comparable results to those described in the preceding paragraph for a 20 minute B-staging procedure.

EXAMPLE 4

This experiment uses a differing approach than that described in Examples 2 and 3.

A silicon wafer was mounted on the chip bonding adhesive/support film product described in the first paragraph of Example 2. The wafer was then scribed to about 80% of the wafer's thickness. After the scribing operation, the wafer/adhesive composite was removed from the support film and was further B-staged at 80° C. for 10 minutes. The wafer/adhesive composite was then cracked into its individual die or chip, with adherent adhesive, and evaluated for mounting characteristics, and was cured and evaluated for void formation and die shear. The results obtained were comparable to those of Example 2 and the first paragraph of Example 3.

EXAMPLE 5

This shows a variant version of the type of adhesive described in Example 1 having a slightly higher silver content and a small amount of added phenyl glycidyl ether for viscosity adjustment.

The following ingredients were used:

| Ingredient | Parts by Weight |
| --- | --- |
| Soluble polyimide resin | 4.0 |
| N—vinyl pyrrolidone | 16.0 |
| Phenyl glycidyl ether | 19.0 |
| Phenol epoxy novolac resin | 16.0 |
| 2,2'-dialkyl bisphenol A* | 12.0 |
| 2-ethyl-4-methyl imidazole** | 2.0 |
| Triallyl-S—triazine-2,4,6-trione | 6.0 |
| Di-t-butyl peroxide | 1.0 |
| Silica filler | 0.4 |

| Ingredient | Parts by Weight |
|---|---|
| Silver powder | 156.0 |

*67% on N—methyl pyrrolidone solvent.
**10% solution in N—methyl pyrrolidone solvent.

EXAMPLE 6

The adhesive of Example 5 was utilized. Samples were prepared by mounting a 4 inch silicon wafer to the previously described chip bonding adhesive/support film article. The wafer was diced to about 80% of its thickness, and the wafer/adhesive composite was released from the support sheet. The composite was further B-staged at 80° C. for either 10 or 20 minute intervals. The 10 minute treatment showed a slight tacky character for the adhesive which might be undesirable, particularly if a plurality of wafer/adhesive composites were to be stored in contact with one another in a stacked arrangement. The 20 minute period showed substantially no adhesive tackiness and had superior non-void characteristics, after curing, for the adhesive.

The wafer was subsequently cracked into individual die (either 200×200 mil or 50×50 mil) which were mounted on either glass or Alloy 42 using a die mounter. The die mounting stateion was at 100° C. to re-wet the substantially non-tacky adhesives and a 100 gm weight was used to apply pressure to the chip during the mounting step.

The substrate was scrubbed for 2.5 second using the Kulicke & Soffa scrub option on the die mounter to enhance the subsequent wetting of the substrate by the adhesive carried by the chip. The chip/adhesive composites were then brought into contact with the selected substrate at 100° C. and were then flash cured at 200° C. for 30 seconds.

The data which follows compares the die shear values (in pounds) for flash cured and conventional cured (120° C. for 20 minutes and 225° C. for 30 minutes) samples with either 10 or 20 minutes B-staging.

| B-STAGING AT 80° C. FOR TEN MINUTES | | | |
|---|---|---|---|
| | Room Temp. Die Shear | 225° C. Die Shear | 300° C. Die Shear |
| 200 × 200 mil Die | | | |
| Flash Cure: | | | |
| Glass | 24 | 2.8 | 2.3 |
| Alloy 42 | >P* | 4.7 | 5.8 |
| Conv. Cure: | | | |
| Glass | >30 | >30 | 13.5 |
| Alloy 42 | >P* | >P* | 6.7 |
| 50 × 50 mil Die | | | |
| Flash Cure: | | | |
| Glass | 4.8 | 0.3 | 0.8 |
| Alloy 42 | 9.3 | 0.5 | 0.5 |
| Conv. Cure: | | | |
| Glass | 8.6 | 4.6 | 2.4 |
| Alloy 42 | 11.6 | 1.3 | 1.2 |

| B-STAGING AT 80° C. FOR TWENTY MINUTES | | | |
|---|---|---|---|
| | Room Temp. Die Shear | 225° C. Die Shear | 300° C. Die Shear |
| 200 × 200 mil Die | | | |
| Flash Cure: | | | |
| Glass | >30 | 2.6 | 7.3 |
| Alloy 42 | >P* | 4.2 | 2.8 |
| Conv. Cure: | | | |
| Glass | >30 | >30 | 11.5 |
| Alloy 42 | >P* | 11.0 | 3.7 |
| 50 × 50 mil Die | | | |
| Flash Cure: | | | |
| Glass | 5.2 | 0.3 | 0.4 |
| Alloy 42 | 12.7 | 0.8 | 1.0 |
| Conv. Cure: | | | |
| Glass | 8.2 | 3.9 | 6.4 |
| Alloy 42 | 10.3 | 2.0 | 4.0 |

*"P" indicates that the pad holding the die broke before the die sheared. The approximate strength of the pad to the lead fingers is 19 pounds.

We claim:

1. A method of bonding a semiconductor chip to a substrate which comprises:
   (a) bonding a tacky, curable and partially cured, non-viscous chip bonding adhesive, which is releasably supported on a support film, to the surface of the chip intended to be bonded to the substrate;
   (b) further partially heat curing the adhesive to convert it to a non-tacky state;
   (c) mounting the chip on the substrate at elevated temperature to change the adhesive to a more tacky state; and
   (d) curing of the adhesive, wherein the chip is in the configuration of a semiconductor wafer, the wafer is mounted on the adhesive on the support film, the wafer is scribed and then cracked into individual chips, the resulting chips with adhesive adhesives are removed from the support film, and the adhesive is converted to a non-tacky state.

2. The method of claim 1 wherein the adhesive comprises an epoxy resin, a soluble polyimide resin, a reactive diluent, and a polyalkenylphenol crosslinking agent.

* * * * *